(12) United States Patent
Wang

(10) Patent No.: US 8,050,097 B2
(45) Date of Patent: Nov. 1, 2011

(54) METHOD OF PROGRAMMING NONVOLATILE MEMORY DEVICE

(75) Inventor: Jong Hyun Wang, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 452 days.

(21) Appl. No.: 12/361,217

(22) Filed: Jan. 28, 2009

(65) Prior Publication Data

US 2010/0008138 A1 Jan. 14, 2010

(30) Foreign Application Priority Data

Jul. 10, 2008 (KR) ........................ 10-2008-0066873

(51) Int. Cl.
*G11C 16/04* (2006.01)
(52) U.S. Cl. .................................. 365/185.18
(58) Field of Classification Search ............. 365/185.18, 365/185.22
See application file for complete search history.

(56) References Cited

U.S. PATENT DOCUMENTS

| 6,567,315 | B2* | 5/2003 | Takase et al. | 365/185.28 |
| 7,342,825 | B2* | 3/2008 | Takeuchi et al. | 365/185.03 |
| 2010/0020602 | A1* | 1/2010 | Baek et al. | 365/185.03 |
| 2010/0232228 | A1* | 9/2010 | Jeon et al. | 365/185.19 |
| 2011/0026331 | A1* | 2/2011 | Dong et al. | 365/185.19 |
| 2011/0051520 | A1* | 3/2011 | Kim | 365/185.19 |

FOREIGN PATENT DOCUMENTS

| KR | 1020050073293 A | 7/2005 |
| KR | 100836762 B1 | 6/2008 |

OTHER PUBLICATIONS

Notice of Preliminary Rejection Issued from Korean Intellectual Property Office on Jan. 26, 2010.

* cited by examiner

*Primary Examiner* — Tuan T. Nguyen
(74) *Attorney, Agent, or Firm* — IP & T Group LLP

(57) ABSTRACT

According to an aspect of a method of programming a nonvolatile memory device, a first program operation command is input, and a program operation is executed according to a program start voltage stored in a program start voltage storage unit. Here, a program voltage, which is applied at a time point at which a memory cell programmed higher than a verify voltage while the program operation is performed occurs for the first time, is updated to a program start voltage.

19 Claims, 4 Drawing Sheets

METHOD OF PROGRAMMING NONVOLATILE MEMORY DEVICE

CROSS-REFERENCE TO RELATED APPLICATION

The present application claims priority to Korean patent application number 10-2008-0066873, filed on Jul. 10, 2008, which is incorporated by reference in its entirety.

BACKGROUND OF THE INVENTION

The present invention relates to a method of programming nonvolatile memory devices and a multi-level cell (MLC) programming method.

Recently, there has been an increasing demand for nonvolatile memory devices that can be electrically programmed and erased and do not need the refresh function of rewriting data at specific intervals.

The nonvolatile memory cell is an element enabling electrical program/erase operations, and is configured to perform the program and erase operations by changing its threshold voltage as electrons migrate in response to a strong electric field applied to a thin oxide layer of 100 angstrom or less.

The nonvolatile memory device typically includes a memory cell array in which cells for storing data are arranged in matrix form, and a page buffer for writing data into specific cells of the memory cell array or reading data stored in specific cells. The page buffer includes a bit line pair connected to a specific memory cell, a register for temporarily storing data to be written into a memory cell array, or reading data of a specific cell from the memory cell array and temporarily storing the read data therein, a sensing node for sensing the voltage level of a specific bit line or a specific register, and a bit line selection unit for controlling whether or not to connect a specific bit line to the sensing node.

As a method of programming this nonvolatile memory device, an incremental step pulse programming (ISPP) method has been known. That is, a program operation is performed by constantly increasing a program start voltage by a step voltage. However, as the number of program and erase operations increases, the program speed of a memory cell increases. Further, even though a low program start pulse is applied, a change in the threshold voltage of a memory cell increases. If the program start voltage is fixed to a specific value as described above, a change in the threshold voltage becomes great due to the increased program/erase numbers. Consequently, a problem may occur in which threshold voltage distributions are widened.

BRIEF SUMMARY OF THE INVENTION

The present invention is directed towards a method of programming nonvolatile memory devices and a MLC programming method, in which a program start voltage can be set variably according to a programmed state without fixing the program start voltage to a specific value.

A method of programming a nonvolatile memory device according to an aspect of the invention includes inputting a first program operation command, and performing a program operation according to a program start voltage stored in a program start voltage storage unit. Here, a program voltage, which is applied at a time point at which a memory cell programmed higher than a verify voltage while the program operation is performed occurs for the first time, is updated to a program start voltage.

A program method of a nonvolatile memory device according to another aspect of the invention includes executing an $n^{th}$ program operation command according to a program start voltage stored in a program start voltage storage unit, updating a program voltage, which is applied at a time point at which a memory cell programmed higher than a verify voltage while the program operation is performed occurs for the first time, to the program start voltage, and executing a $(n+1)^{th}$ program operation command according to the updated program start voltage.

A MLC programming method of a nonvolatile memory device according to still another aspect of the invention includes inputting a first program operation command, executing a first logical page program operation according to a first logical page program start voltage stored in a first logical page program start voltage storage unit, updating a program voltage, which is applied at a time point at which a memory cell programmed higher than a lowest verify voltage while the first logical page program operation is performed occurs for the first time, to the first logical page program start voltage, completing the first logical page program operation, performing a second logical page program operation according to a second logical page program start voltage stored in a second logical page program start voltage storage unit, updating a program voltage, which is applied at a time point at which a memory cell programmed higher than a lowest verify voltage while the second logical page program operation is performed occurs for the first time, to the second logical page program start voltage, and completing the second logical page program operation, thereby completing the execution of the first program operation command.

An n-bit MLC programming method of a nonvolatile memory device according to further still another aspect of the invention includes inputting an $m^{th}$ program operation command, and sequentially executing first to $n^{th}$ logical page program operations according to first to $n^{th}$ logical page program start voltages, each stored in first to $n^{th}$ logical page program start voltage storage units. Here, a program voltage, which is applied at a time point at which a memory cell programmed higher than a lowest verify voltage while a program operation of each logical page is performed occurs for the first time, is updated to each logical page program start voltage.

DESCRIPTION OF SPECIFIC EMBODIMENTS

Now, specific embodiments according to the present invention will be described with reference to the accompanying drawings. However, the invention is not limited to the disclosed embodiments, but may be implemented in various ways. The embodiments are provided to complete the disclosure of the invention and to allow those having ordinary skill in the art to understand the scope of the invention. The invention is defined by the category of the claims.

Figure 1:
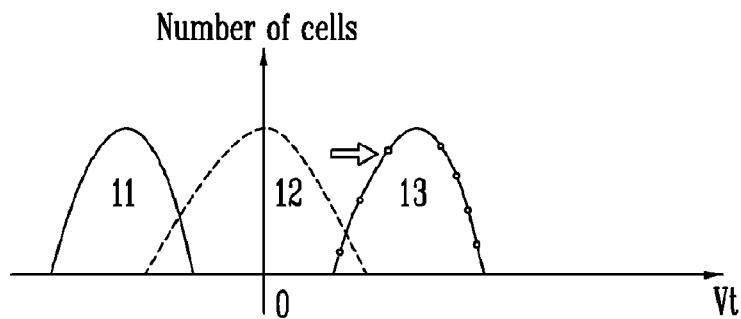
FIG. 1 is a diagram showing a change in threshold voltage distributions when a first pulse is applied upon ISPP of a typical nonvolatile memory device.

FIG. 1 is a diagram showing a change in threshold voltage distributions when a first pulse is applied upon ISPP of a typical nonvolatile memory device.

As shown in FIG. 1, if a first pulse of ISPP is applied to cells 11 being in an erase state, the threshold voltage of the cells rises and, therefore, a threshold voltage distribution 12 shifts to the right. However, in the case in which program/erase operations are repeatedly performed on a nonvolatile memory device, there is a tendency that the program speed becomes fast due to the characteristics of a memory cell. That is, if a first program pulse is applied with the program/erase numbers being increased, the degree of threshold voltage distributions as in a distribution 13 is increased as compared with the distribution 12.

In summary, as the program/erase numbers of a nonvolatile memory device increases, a change in the threshold voltage, which is accompanied by application of a first pulse upon ISPP, is increased. There has been known a method of lowering the voltage level of a first pulse and applying a lowered voltage, when considering a change in the program speed according to an increase in the program/erase numbers as described above.

Figure 2:
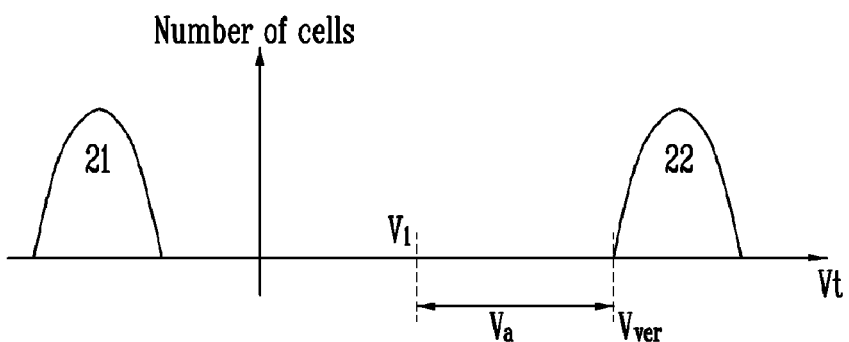
FIG. 2 is a diagram showing a method of setting the voltage level of a first pulse upon ISPP of a nonvolatile memory device.

FIG. 2 is a diagram showing a method of setting the voltage level of a first pulse upon ISPP of a nonvolatile memory device.

In the case in which cells 21 being in an erased state are sought to be programmed to have a verify voltage (Vver) or higher, that is, in the case in which cells 22 being in a programmed state are to be formed, a program start voltage is set considering a change in the threshold voltage when a first program pulse is applied according to an increase in the program/erase numbers.

In other words, the program start voltage is set such that the threshold voltage of a cell, which has the fastest change in the threshold voltage when the first program voltage is applied, becomes a first voltage (V1). A difference Va between the verify voltage Vver and the first voltage (V1) is decided considering a change in the threshold voltage when the first program pulse is applied according to an increase in the program/erase numbers.

For example, assuming that, after one program/erase operation has been performed, the first voltage (V1) when the first program pulse is applied is 0.1V, and, after 1000 program/erase operations have been performed, the first voltage (V1) when the first program pulse is applied is 1.1V, a change in the threshold voltage according to the application of the first program pulse is 1V. Accordingly, a program start voltage is set considering this change such that the first voltage (V1) when the first program pulse is applied becomes 0.1V in the case in which the 1000 program/erase operations are performed.

However, in this case, the program start voltage itself is set low considering the increase in the program/erase numbers and the set program start voltage is fixed. Thus, when the program/erase number is low, the first program pulse functions as a dummy program pulse that does not play a special role. That is, a problem arises because the entire program speed is decreased.

Accordingly, the invention presents a method of variably setting a program start voltage according to a change in the program/erase numbers.

Figure 3:
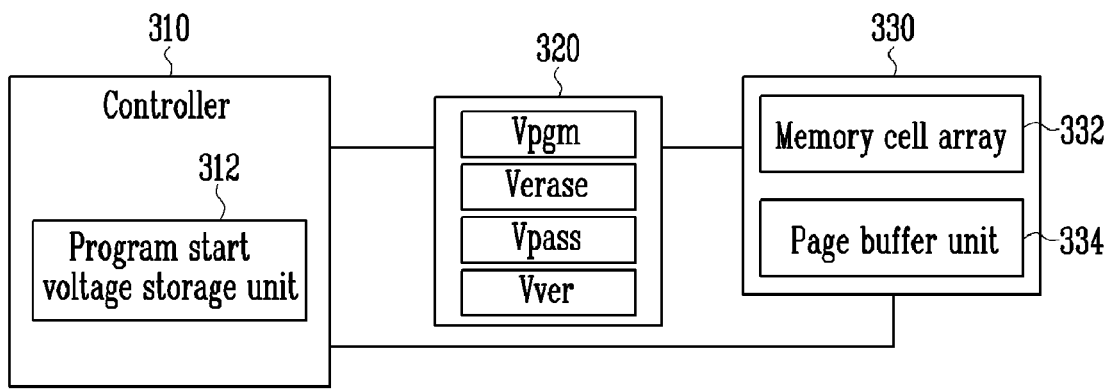
FIG. 3 is a block diagram showing the configuration of a nonvolatile memory device, which is applied to the present invention.

FIG. 3 is a block diagram showing the configuration of a nonvolatile memory device, which is applied to the invention.

A nonvolatile memory device 300 includes a controller 310, a voltage supply unit 320, and a memory cell 330.

The controller 310 controls a program operation, an erase operation, a read operation, a verify operation and so on of a nonvolatile memory cell. That is, the controller 310 controls externally input data to be programmed into a memory cell having a desired address according to an externally input control signal and controls data, stored in a memory cell of a specific address, to be read. Further, the controller 310 performs a verify operation for checking whether a program has been completed according to external input data when executing a program operation. In executing the various operations, the controller 310 activates a memory cell of a specific address and controls a voltage suitable for each operation to be applied.

Meanwhile, the controller 310 includes a program start voltage storage unit 312. The program start voltage storage unit 312 stores a level of a program start voltage, which becomes the first pulse of an ISPP operation. To this end, the program start voltage storage unit 312 has a register form. In the invention, a program start voltage is varied according to the program/erase numbers and applied. For this purpose, the program start voltage storage unit 312 stores an initial value of a program start voltage, and the program start voltage is reset whenever a program operation is completed. A reset value can differ from the value, which is stored before resetting, or may be identical to the value stored before resetting according to an operation.

Meanwhile, the program start voltage storage unit 312 can be configured in various ways according to the form of a memory cell to be updated.

Figure 4:
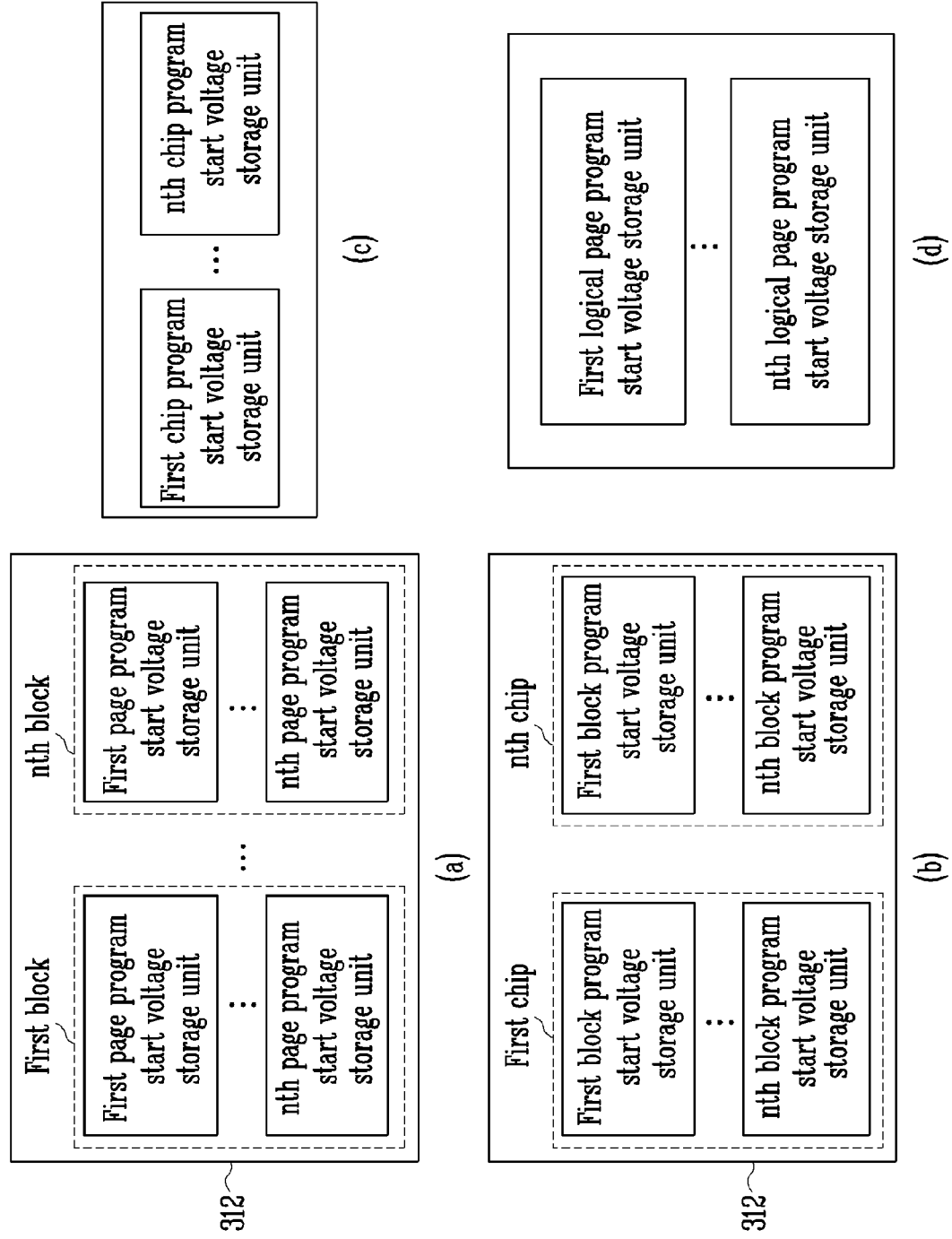
FIG. 4 illustrates various forms of a program start voltage storage unit in accordance with an embodiment of the invention.

FIG. 4 illustrates various forms of the program start voltage storage unit in accordance with an embodiment of the invention.

FIG. 4(A) illustrates an embodiment in which a program start voltage is stored on a page basis. Thus, the program start voltage storage unit includes first to $n^{th}$ page program start voltage storage units, which are responsible for each memory cell block. Further, different program start voltages can be applied on a page basis.

Meanwhile, as the program/erase numbers increase, the program start voltage is updated. A program start voltage, which is applied at a time point at which any one of target program cells included in a page is programmed higher than a verify voltage, is stored in the program start voltage storage unit. According to the tendency of a nonvolatile cell whose program speed increases as the program/erase numbers increases, the program start voltage is changed as follows. In other words, in the case in which the program/erase numbers are small in the state where a dummy program pulse is applied, only when a program pulse value is increased to some extent, any one of target program cells can be programmed higher than a verify voltage, and a voltage, which is higher than the verify voltage, can be stored in the program start voltage storage unit. However, in the case in which the program/erase numbers are great, although a program pulse of a low voltage is applied, any one of target program cells can be programmed higher than a verify voltage, and a voltage, which is lower than a voltage already stored in the program start voltage storage unit, can be stored in the program start voltage storage unit.

FIG. 4(B) illustrates an embodiment in which a program start voltage is stored every memory cell block. Thus, the program start voltage storage unit includes first to $n^{th}$ block program start voltage storage units. Further, different program start voltages can be applied on a block basis. However, the same program start voltage is applied to different pages included in the same block.

In the present embodiment, the program start voltage update method shown in FIG. 4(A) is basically used. That is, a program start voltage, which is applied at a time point at which any one of target program cells is programmed higher than a verify voltage on the basis of a specific page, is stored in the program start voltage storage unit. Here, according to a person who practices the present embodiment, the program start voltage can be updated on the basis of only a specific page included in one block and can be updated on the basis of a plurality of pages or the entire pages.

The former method can employ a method of updating the program start voltage on the basis of a specific page and applying this method equally to the entire pages included in a corresponding block. Therefore, the program start voltage update is generated only at the time of a program operation on a specific page.

In the case of the latter method, a program start voltage of the program start voltage storage unit is updated whenever a program operation is performed on a plurality of selected pages. Therefore, program start voltage updates are generated as many as the number of pages selected from pages included in a memory cell block. An erase operation is performed on the entire pages included in one memory cell block at the same time. Thus, it can be seen that characteristics according to a change in the program/erase numbers are almost identical across the pages. Accordingly, it can be seen that, although the program start voltage is updated whenever a program operation is performed on a plurality of selected pages, there is almost no difference in updated program start voltages as compared with the update method performed on the basis of only one page.

FIG. 4(C) illustrates an embodiment in which a program start voltage is stored on a chip basis. Thus, the program start voltage storage unit includes first to $n^{th}$ chip program start voltage storage units. Further, different program start voltages can be applied on a chip basis. However, the same program start voltage is applied to different blocks included in the same chip. The chip is the unit of memory cells that are driven in response to a different chip enable signal.

Since an erase operation is performed every memory cell block, the program/erase numbers of memory cell blocks included in the same chip may differ. However, in the present embodiment, a wear-leveling method of preventing a phenomenon in which the program operation, the erase operation, etc. are concentrated on a specific block and therefore the program/erase numbers are increased is applied. Accordingly, it can be assumed that characteristics according to a change in the program/erase numbers of the entire blocks included in one chip are almost identical.

A method of updating a program start voltage on the basis of one or more pages included in a chip is used based on this assumption. That is, a program start voltage is measured on the basis of a specific page, and a measured value is identically applied to the entire pages included in the chip.

FIG. 4(D) shows the configuration of a program start voltage storage unit when a MLC programming method is used.

According to the MLC programming method, a least significant bit (LSB) program and a most significant bit (MSB) program are performed on one physical page and therefore one cell has four or more cell states. That is, when an n-bit MLC program is performed, one cell can have a total of $2^n$ cell states.

In the case in which a 2-bit MLC program is performed, two logical pages, that is, a LSB page on which the LSB program has been performed and a MSB page on which the MSB program has been performed are formed in one physical page. In accordance with a 3-bit MLC program, three logical pages are formed and, in accordance with an n-bit MLC program, n logical pages are formed. Here, it is necessary to apply different program start voltages on a logical-page basis. Therefore, when the MLC program is carried out, the program start voltage storage unit is configured suitably for the number of the logical pages.

In other words, in the case in which a n-bit MLC program operation is executed, a first logical page program start voltage storage unit, a second logical page program start voltage storage unit, . . . , and an $n^{th}$ logical page program start voltage storage unit are included.

Meanwhile, a time point at which each program start voltage storage unit is updated is when a program voltage at a time point at which any one cell, which has been programmed higher than the lowest verify voltage, occurs is stored as a new program start voltage. For example, in the case of a 2-bit MLC program, at the time of a first logical page (LSB page) program, verification is performed on the basis of one verify voltage and, at the time of a second logical page (MSB page) program, verification is performed on the basis of two or more verify voltages. At this time, a program voltage at a time point at which any one cell, which has been programmed higher than the lowest verify voltage, occurs is stored as a new program start voltage.

Meanwhile, the first to $n^{th}$ logical page program start voltage storage units are configured to be included in the respective program start voltage storage units shown in FIG. 4(A), (B) or (C). In other words, the respective page program start voltage storage units shown in FIG. 4(A) can be configured to be included in the first to $n^{th}$ logical page program start voltage storage units, the respective block program start voltage storage units shown in FIG. 4(B) can be configured to be included in the first to $n^{th}$ logical page program start voltage storage units, or the respective chip program start voltage storage units shown in FIG. 4(C) can be configured to be included in the first to $n^{th}$ logical page program start voltage storage units.

The remaining constituent elements are described below with reference back to FIG. 3.

The voltage supply unit 320 supplies various voltages to the memory cell 330 under the control of the controller 310. In particular, at the time of a program operation, the voltage supply unit 320 applies a program pulse according to a program start voltage stored in the program start voltage storage unit 312.

The memory cell 330 includes a memory cell array 332 and a page buffer unit 334. The memory cell array 332 has a plurality of memory cells integrated in matrix form. The page buffer unit 334 temporarily stores external data, which will be stored in each memory cell, and stores data read from memory cells.

A single page buffer (not shown) included in the page buffer unit 334 is coupled to an even bit line BLe and an odd bit line BLo, and the respective bit lines are coupled to one cell string. Memory cells connected to a single word line constitute a page. A program operation is performed on a page basis. Whether or not a program on a corresponding page has been completed can be verified through the page buffer unit 334.

Now, a program method of the invention is described.

Figure 5:
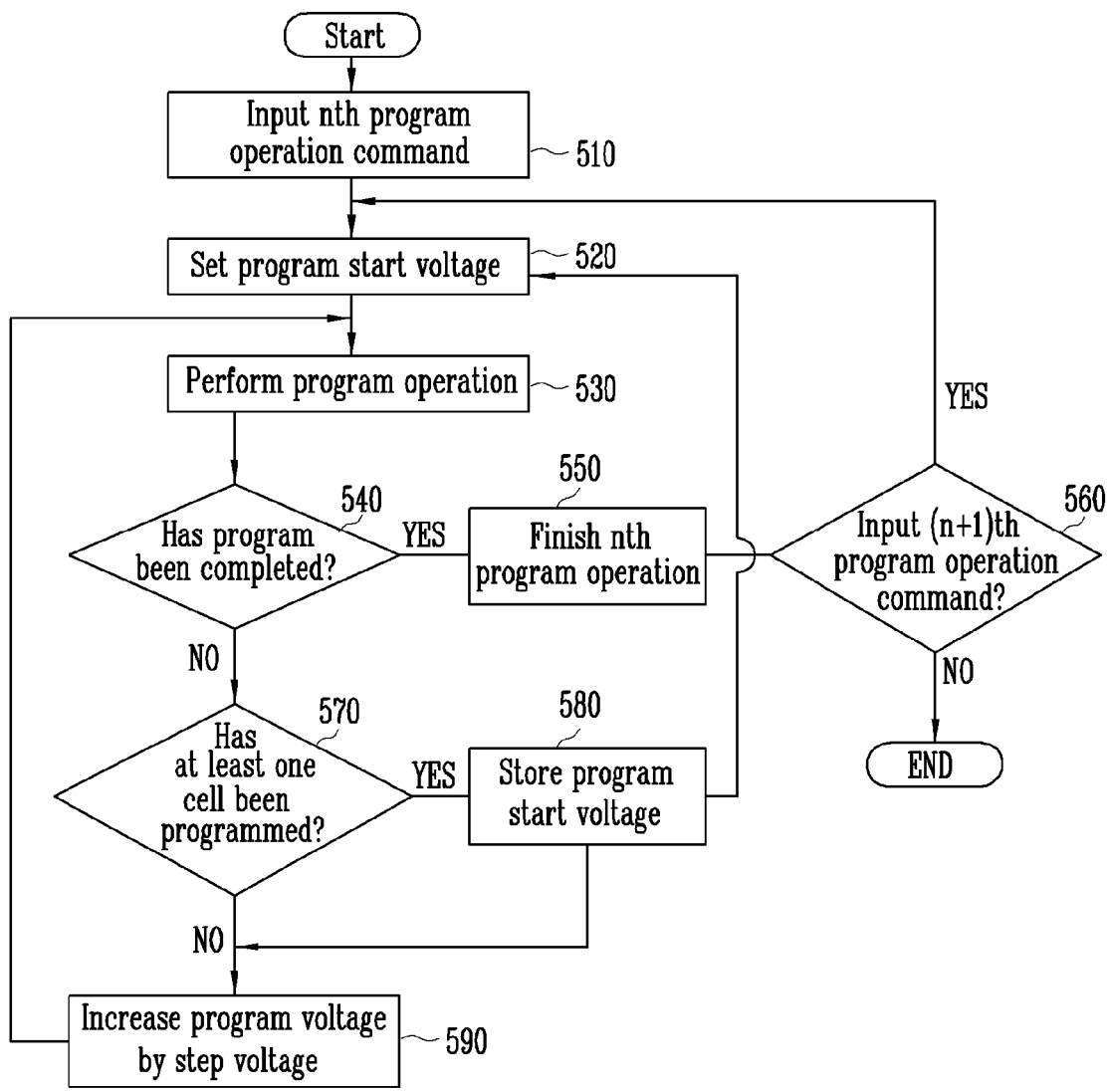
FIG. 5 is a flowchart illustrating a program method of a nonvolatile memory device in accordance with an embodiment of the invention.

FIG. 5 is a flowchart illustrating a program method of a nonvolatile memory device in accordance with an embodiment of the invention.

First, an $n^{th}$ program operation command is received in step 510.

In the case of n=1, that is, a program operation command is input for the first time. As the program operation command is input newly, 'n' is increased.

A program start voltage is then set in step 520.

In the invention, a program operation is executed according to the ISPP method and thus a program start voltage and a step voltage have to be set. This step is a step of setting the program start voltage.

To this end, a value stored in the program start storage unit 312 is read and set as the program start voltage. For a detailed configuration of the program start voltage storage unit 312, reference can be made to FIGS. 3 and 4.

A program operation is then performed according to the set program start voltage in step 530. Here, the program operation is performed on a specific memory cell according to data input to the page buffer by applying a program voltage to a selected word line and a pass voltage to the remaining word lines.

It is then verified whether memory cells, which had been sought to be programmed using the program operation, have all been programmed higher than verify voltages in step 540.

If, as a result of the verification in step 540, the memory cells have all been programmed higher than the verify voltages, an $n^{th}$ program operation is finished in step 550. It is then determined whether a $(n+1)^{th}$ program operation command has been input in step 560. If, as a result of the determination, the $(n+1)^{th}$ program operation command has been input, the process returns to the step (520) in which a program start voltage is set.

However, if, as a result of the verification, the memory cells have not been programmed, that is, if there exists any target program memory cell that has not been programmed higher than the verify voltage, it is determined whether at least one memory cell has been programmed higher than the verify voltage in step 570.

If, as a result of the determination in step 570, a specific memory cell has been programmed higher than the verify voltage, the corresponding cell is turned on and a current path of a cell string in which the corresponding cell is included is blocked. Thus, the voltage level of a bit line, which has been precharged to a high level, remains intact and is transferred to a sensing node without change. Since the voltage level of the sensing node is a high level, data stored in a register is changed. If there is any one cell whose data has been changed in the entire page buffers, the cell is determined to be programmed higher than the verify voltage.

The step 570 is for updating a program start voltage. A program voltage, which is applied at a time point at which at least one memory cell is programmed higher than a verify voltage, is stored in the program start voltage storage unit in step 580. Through the step 580, a program start voltage stored in the program start voltage storage unit just before is updated. The program start voltage stored in step 580 is referred through the step (520) of setting the program start voltage in each program operation.

If there is no cell that has been programmed higher than the verify voltage as a result of the determination in step 570 or after the program start voltage is updated in step 580, the program voltage is increased by the step voltage in step 590. The process then returns to the step (530) and the subsequent processes are performed repeatedly.

Meanwhile, when the MLC programming method is applied, the program method becomes different a little.

Figure 6:
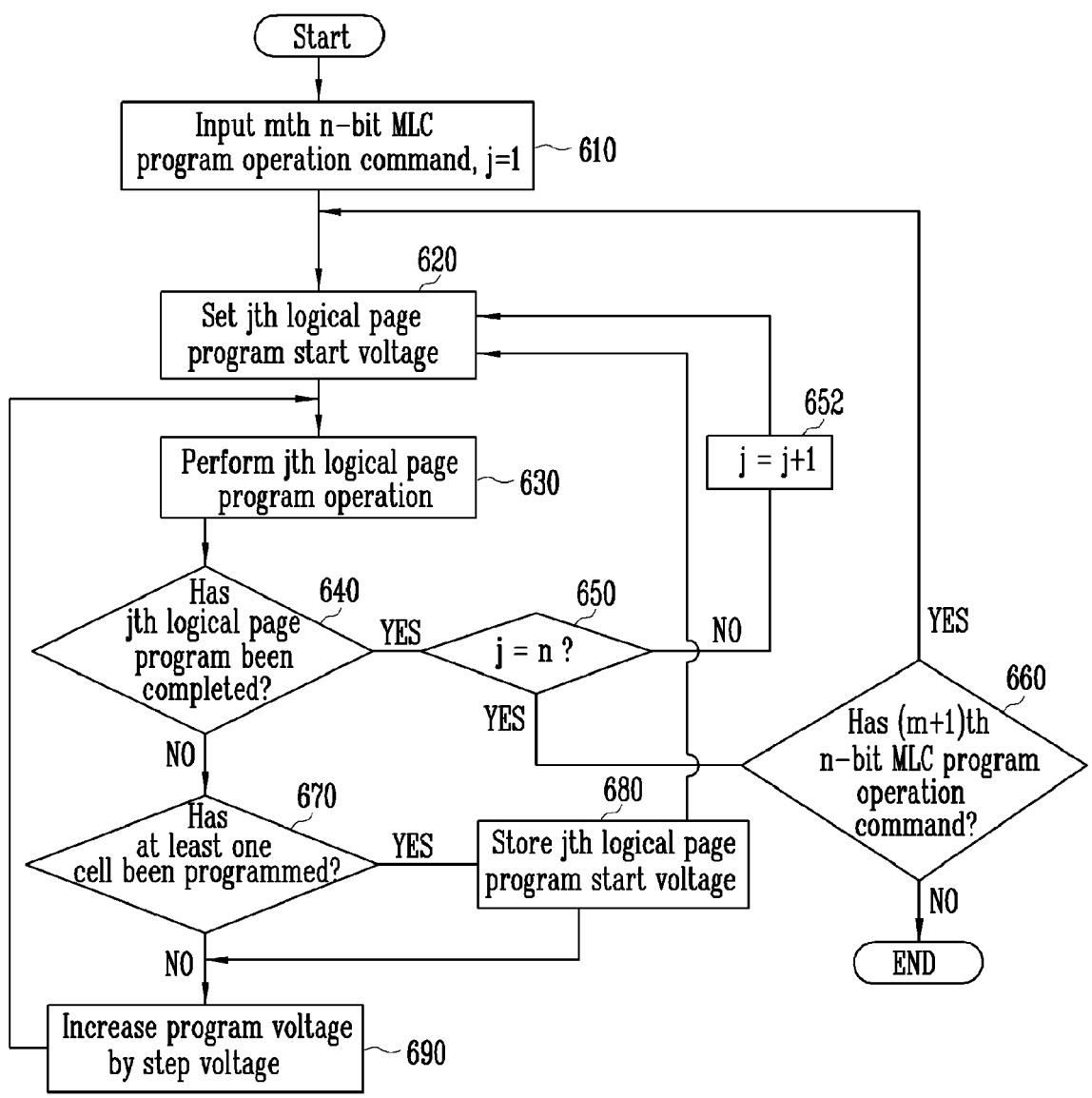
FIG. 6 is a flowchart illustrating a program method of a nonvolatile memory device in accordance with another embodiment of the invention.

FIG. 6 is a flowchart illustrating a program method of a nonvolatile memory device in accordance with another embodiment of the invention.

In the case in which the program method of FIG. 5 is applied to a MLC programming method, a plurality of logical page program operations are performed on one physical page. Start voltages of the respective logical page programs need not to be set differently. Thus, when an n-bit MLC program is performed, first to $n^{th}$ logical page program start voltage storage units are included as in FIG. 4(D).

First, an $m^{th}$ n-bit MLC program operation command is received in step 610. In the event of m=1, that is, a program operation command is input for the first time. As the program operation command is input newly, 'm' is increased. Meanwhile, 'j=1' is reset, where the value j is a parameter for distinguishing each logical page.

Next, a $j^{th}$ logical page program start voltage is set in step 620.

As mentioned earlier, in the case of an n-bit MLC program, n logical pages are formed and a program start voltage is set differently on a logical-page basis. The program start voltage is set sequentially from a first logical page. Here, after a program of a specific logical page is completed, a program is performed on the second-highest logical page. Thus, the program start voltage is set sequentially from a logical page being responsible for the least significant bit.

To this end, a value stored in the first logical page program start voltage storage unit included in the program start storage unit 312 is read and set as the program start voltage. For a detailed configuration of the program start voltage storage unit 312, reference can be made to FIGS. 3 and 4.

A $j^{th}$ logical page program operation is performed according to the set program start voltage in step 630. The program operation is performed on a specific memory cell according to data input to the page buffer by applying a program voltage to a selected word line and a pass voltage to the remaining word lines.

It is then verified whether memory cells, which had been sought to be programmed using the program operation, have all been programmed higher than respective verify voltages in step 640.

In the case of a MLC program, the number of verify voltages increases since the number of programmed states increases as the program proceeds from the LSB program to the MSB program. Thus, only when cells set to be programmed in a specific state are all programmed higher than respective verify voltages, a program of a corresponding logical page is completed.

If, as a result of the verification in step 640, the memory cells have all been programmed higher than the respective verify voltages, it is checked whether there is a next logical page to be programmed in step 650. That is, if an n-bit MLC program had been expected to be performed, a total of n logical page programs have to be performed. If, as a result of the check in step 650, there is a next logical page to be programmed, the parameter j is increased in step 652, and the process then returns to the step (620) in which a program start voltage of a next logical page to be programmed is set. A program start voltage of the corresponding logical page is read from the program start voltage storage unit shown in FIG. 4(D) according to the parameter j and set as the program start voltage.

However, if, as a result of the check in step 650, there is no logical page to be programmed (j=n), the $m^{th}$ program operation is finished, and it is then determined whether a $(m+1)^{th}$ program operation command has been input in step 660. If, as a result of the determination in step 660, the process returns to the step (620) in which the j$^{th}$ logical page program start voltage is set.

Meanwhile, if, as a result of the verification in step 640, the memory cells have not been programmed higher than the respective verify voltages, that is, there is a cell that has not been programmed higher than the verify voltage among target program memory cells, it is determined whether at least one memory cell has been programmed higher than the verify voltage in step 670. If, as a result of the determination, a specific cell has been programmed higher than the verify voltage in step 670, the corresponding cell is turned on and a current path of a cell string to which the corresponding cell belongs is blocked. Thus, the voltage level of a bit line, which has been precharged to a high level, remains intact and is transferred to a sensing node without change. Since the voltage level of the sensing node is a high level, data stored in a register is changed. If there is any one cell whose data has been changed in the entire page buffers, the cell is determined to be programmed higher than the verify voltage.

The step 670 is for updating a program start voltage. A program voltage, which is applied at a time point at which at least one memory cell is programmed higher than a verify voltage, is stored in the program start voltage storage unit in step 680. Through the step 680, a program start voltage stored in the program start voltage storage unit just before is updated.

Meanwhile, in the case of a MLC program, the number of verify voltages is different on a logical-page basis, and the number of verify voltages is 1 or more. Thus, a program voltage, which is applied at a time point at which there exist one or more memory cells programmed higher than the lowest one of verify voltages on a logical-page-program basis, is set as a program start voltage.

Further, since each logical page program start voltage storage unit is constructed separately, a program start voltage is stored in a corresponding storage unit and updated.

The program start voltage updated in step 680 is refereed through the program start voltage setting step 620 every program operation.

If there is no cell programmed higher than the verify voltage as a result of the determination in step 670 or after the program start voltage is updated in step 680, the program voltage is increased by the step voltage in step 690. The process returns to the step 630 and the subsequent processes are performed repeatedly.

As described above, a program start voltage can be set variably according to the state of each memory cell. That is, at the time of an initial operation in which the program/erase numbers are small, a program start voltage slightly higher than an initially set voltage is applied according to a result of a just-before program operation. At the time of a later operation in which the program/erase numbers are great, a little low program start voltage is applied since the program speed becomes fast in view of memory cell characteristics.

In accordance with the invention, at the time of a program operation, an ISPP operation can be performed by variably setting a program start voltage in accordance with an increase in the program/erase numbers. Accordingly, when the program/erase numbers are small, a program operation can be performed according to a slightly high program start voltage and, when the program/erase numbers are great, a program operation can be performed according to a slightly low program start voltage. Thus, although a dummy program pulse is not applied separately, a program operation can be performed by reflecting a change in the program speed according to an increase in the program/erase numbers. Accordingly, there is an advantage in that distributions of the threshold voltage can be maintained constantly.

The embodiments disclosed herein have been proposed to allow a person skilled in the art to easily implement the invention, and the person skilled in the part may implement the invention by a combination of these embodiments. Therefore, the scope of the invention is not limited by or to the embodiments as described above, and should be construed to be defined only by the appended claims and their equivalents.

What is claimed is:

1. A method of a programming nonvolatile memory device, comprising:
   inputting a first program operation command; and
   performing a program operation according to a program start voltage stored in a program start voltage storage unit,
   wherein a program voltage, which is applied at a time point at which a memory cell programmed higher than a verify voltage while the program operation is performed occurs for a first time, is updated to the program start voltage.

2. The programming method of claim 1, further comprising, when a second program operation command is executed after execution of the first program operation command is completed, executing a program operation according to the updated program start voltage.

3. The programming method of claim 2, wherein the execution of each program operation includes repeatedly adding a step voltage to the program start voltage until target program cells are programmed higher than a verify voltage.

4. The programming method of claim 1, wherein the updating of the program voltage includes replacing a previously stored program start voltage with a program voltage, which is applied at a time point at which a memory cell programmed higher than a verify voltage occurs for the first time.

5. A multi-level cell (MLC) programming method of a nonvolatile memory device, the method comprising:
   inputting a first program operation command;
   executing a first logical page program operation according to a first logical page program start voltage stored in a first logical page program start voltage storage unit;
   updating a program voltage, which is applied at a time point at which a memory cell programmed higher than a lowest verify voltage while the first logical page program operation is performed occurs for the first time, to the first logical page program start voltage;
   completing the first logical page program operation;
   performing a second logical page program operation according to a second logical page program start voltage stored in a second logical page program start voltage storage unit;
   updating a program voltage, which is applied at a time point at which a memory cell programmed higher than a lowest verify voltage while the second logical page program operation is performed occurs for the first time, to the second logical page program start voltage; and
   completing the second logical page program operation, thereby completing the execution of the first program operation command.

6. The MLC programming method of claim 5, further comprising executing a program operation according to the updated first and second logical page program start voltages when a second program operation command is executed.

7. A method of programming a nonvolatile memory device, comprising:

executing an $n^{th}$ program operation command according to a program start voltage stored in a program start voltage storage unit;

updating a program voltage, which is applied at a time point at which a memory cell programmed higher than a verify voltage while the program operation is performed occurs for the first time, to the program start voltage; and executing a $(n+1)^{th}$ program operation command according to the updated program start voltage.

8. The program method of claim 7, wherein the execution of each program operation command includes repeatedly adding a step voltage to the program start voltage until target program cells are programmed higher than a verify voltage.

9. The programming method of claim 7, wherein the updating of the program voltage includes replacing a previously stored program start voltage with a program voltage, which is applied at a time point at which a memory cell programmed higher than a verify voltage occurs for the first time.

10. The programming method of claim 7, wherein the program start voltage storage unit comprises first to $n^{th}$ page program start voltage storage units for storing different program start voltages on a page basis.

11. The programming method of claim 7, wherein the program start voltage storage unit comprises first to $n^{th}$ block program start voltage storage units for storing different program start voltages on a memory-cell-block basis.

12. The programming method of claim 7, wherein the program start voltage storage unit comprises first to $n^{th}$ chip program start voltage storage units for storing different program start voltages on a chip basis.

13. An n-bit MLC programming method of a nonvolatile memory device, the method comprising:

inputting an $m^{th}$ program operation command; and sequentially executing first to $n^{th}$ logical page program operations according to first to $n^{th}$ logical page program start voltages, each stored in first to $n^{th}$ logical page program start voltage storage units, wherein a program voltage, which is applied at a time point at which a memory cell programmed higher than a lowest verify voltage while a program operation of each logical page is performed occurs for a first time, is updated to each logical page program start voltage.

14. The n-bit MLC programming method of claim 13, further comprising, when the $(m+1)^{th}$ program operation command is executed, sequentially executing the first to $n^{th}$ logical page program operations according to the updated first to $n^{th}$ logical page program start voltages.

15. The n-bit MLC programming method of claim 14, wherein the sequential execution of the respective logical page program operations includes repeatedly adding a step voltage to the program start voltage until target program cells are programmed higher than a verify voltage.

16. The n-bit MLC programming method of claim 13, wherein the updating of the program voltage includes replacing a previously stored logical page program start voltage with a program voltage, which is applied at a time point at which a memory cell programmed higher than a verify voltage occurs for the first time.

17. The n-bit MLC programming method of claim 13, wherein the first to $n^{th}$ logical page program start voltage storage units comprise first to $n^{th}$ page program start voltage storage units for storing different program start voltages on a page basis.

18. The n-bit MLC programming method of claim 13, wherein the first to $n^{th}$ logical page program start voltage storage units comprise first to $n^{th}$ block program start voltage storage units for storing different program start voltages on a memory-cell-block basis.

19. The n-bit MLC programming method of claim 13, wherein the first to $n^{th}$ logical page program start voltage storage units comprise first to $n^{th}$ chip program start voltage storage units for storing different program start voltages on a chip basis.

* * * * *